United States Patent [19]

Kanamaru

[11] 3,758,864

[45] Sept. 11, 1973

[54] REMOTE-CONTROL TUNING SYSTEM

[75] Inventor: Toshiji Kanamaru, Osaka, Japan

[73] Assignee: Matsushita Electric Industrial Co., Ltd., Osaka, Japan

[22] Filed: Nov. 26, 1971

[21] Appl. No.: 202,326

[30] Foreign Application Priority Data

Nov. 28, 1970 Japan .............................. 45/105095

[52] U.S. Cl. .................. 325/392, 325/465, 340/171
[51] Int. Cl. ................................ 334 14, H04b 1/06
[58] Field of Search .................... 325/390, 392, 464, 325/465; 340/171, 171 PF; 334/11, 14, 15, 16, 64; 307/252 N

[56] References Cited

UNITED STATES PATENTS 3,654,557 4/1972 Sakamoto ............................ 334/15
3,543,239 11/1970 Wallace ............................ 340/171
3,568,112 3/1971 Thomas ............................ 334/15

*Primary Examiner*—Robert L. Griffin
*Assistant Examiner*—William T. Ellis
*Attorney*—Richard K. Stevens, Robert J. Frank et al.

[57] ABSTRACT

A remote-control tuning system comprising a varactor diode in which a DC voltage applied to the varactor diode is remote controlled to be tuned to a desired channel, whereby even if the desired channel is far from the preceding channel, an immediate switching is made to the desired channel.

5 Claims, 9 Drawing Figures

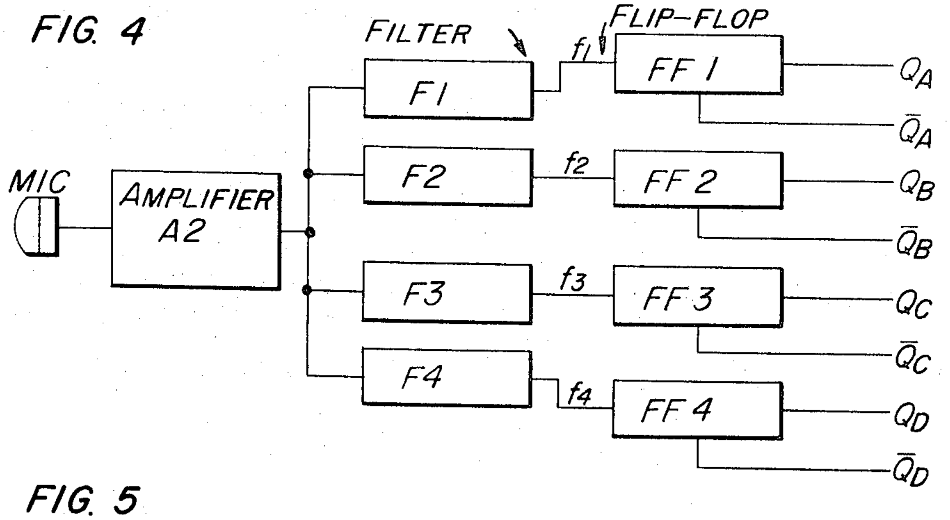
FIG. 5
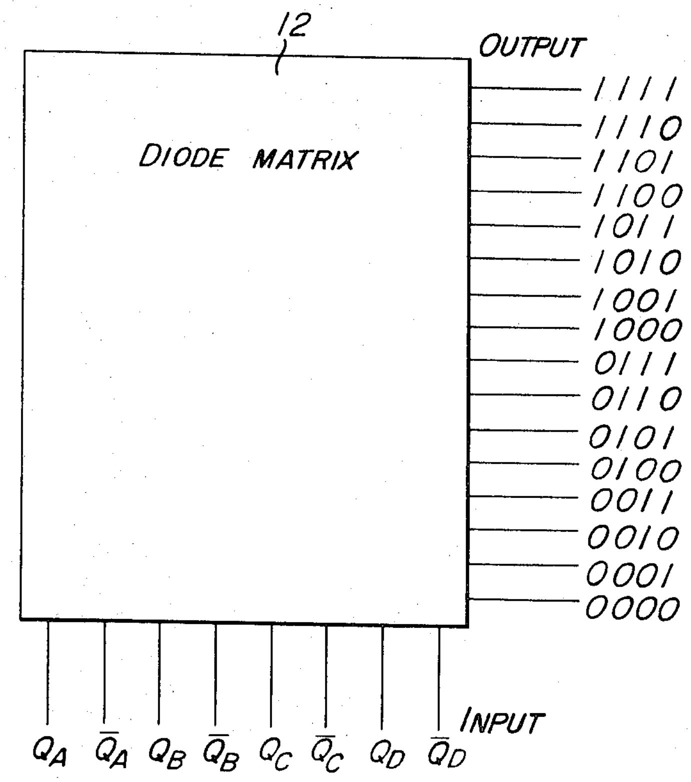

REMOTE-CONTROL TUNING SYSTEM

The present invention relates to a remote-control tuning system.

A television receiver is widely used in which a DC voltage applied to a varactor diode in a tuner is remote controlled to achieve tuning to a desired channel. The receiver of this kind has a configuration as shown in FIG. 1, where the reference numeral 1 shows an electronically — operated tuner containing a varactor diode which is capable of tuning to a channel corresponding to a DC voltage (channel voltage) applied through the line 2. Numeral 3 shows a tuning device for selecting a channel voltage by moving the movable terminal of the variable resistor 4. Numeral 5 shows a power supply for generating a channel voltage, numeral 6 a motor for driving the tuning device 4, numeral 7 a tuning switch mounted on the front panel of the receiver, numeral 8 a tuning switch such as a relay remote controlled with an ultrasonic wave, and numeral 9 a power supply for the motor 6.

In this system, the motor 6 is driven by closing the tuning switch 7 or 8, so that the tuning device 3 is energized to move the movable terminal of the variable resistor 4. A voltage corresponding to a desired channel is thus picked up from the variable resistor 4 and applied to the varactor diode of the tuner 1 to accomplish a tuning operation.

In this type of receiver, the motor 6 is driven for channel selection. Therefore, it is impossible to switch directly, say, from channel 1 to channel 10, skipping the intermediate channels. Also, the ultrasonic wave which communicates between a remote-control transmitter and a remote-control receiver housed in the receiver for controlling the tuning switch 8 consists of a signal of a single wavelength, resulting in frequent erroneous operations of the receiver due to external noise.

The present invention which is aimed at obviating the above-mentioned disadvantage of the conventional system has an object to provide a remote-control tuning system which is capable of selecting a desired channel as soon as it is designated.

Another object of the present invention is to provide a remote-control tuning system with stable operation, eliminating any erroneous operation due to external noises.

Still another object of the present invention is to provide a tuning system which is capable of selecting a desired channel electronically without the mechanical operation of a motor.

The above and other objects, features and advantages will be made apparent by the detailed description taken in conjunction with the accompanying drawings, in which:

FIG. 4 is a block diagram showing a receiver circuit;

FIG. 5 is a diagram showing the relations between the inputs and outputs of a diode matrix circuit;

Figure 1:
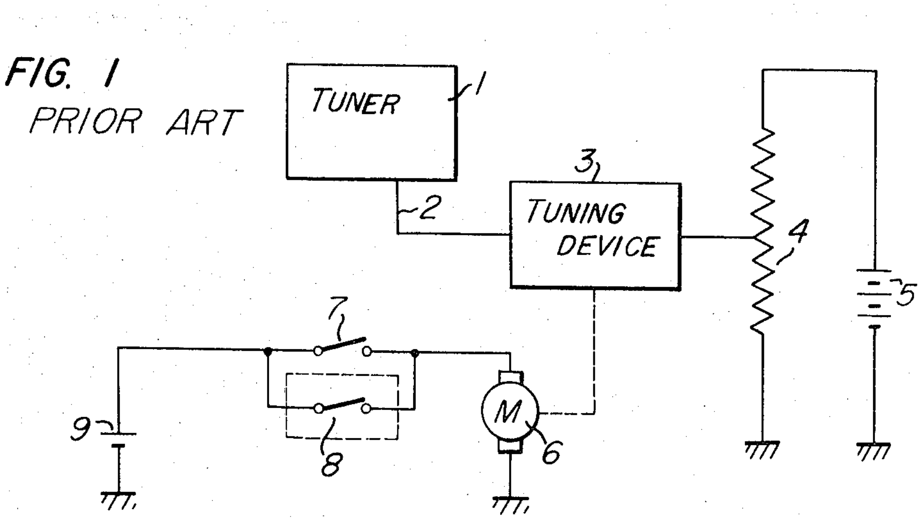
FIG. 1 is a circuit diagram showing a conventional tuning system.
Figure 2:
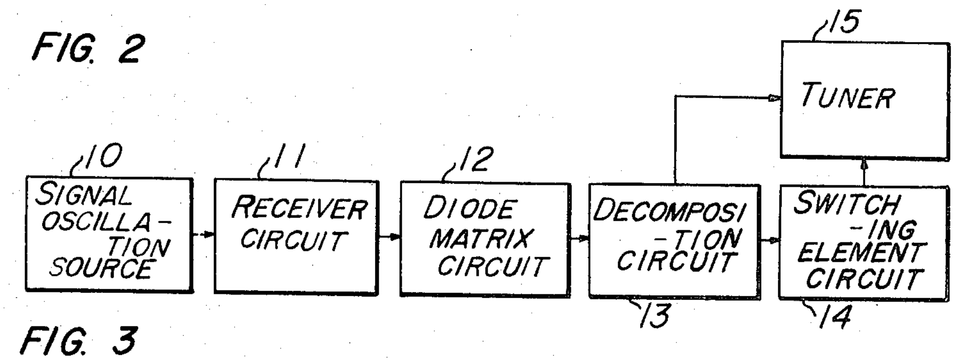
FIG. 2 is a block diagram showing a remote-control tuning system embodying the present invention.

An embodiment of the present invention will now be explained. An outline of the construction of the invented system is shown in FIG. 2, where the reference numeral 10 shows a signal oscillation source for remote control operation. This signal oscillation source may be considered to be housed in the receiver set. Numeral 11 shows a receiver circuit which picks up a desired signal on receipt of a signal generated by the signal oscillation source 10, numeral 12 a diode matrix circuit for decomposing the signal from the receiver circuit 11 into several kinds of signals, numeral 13 a decomposition circuit for generating various control signals out of the output signals from the diode matrix circuit 12, and numeral 14 a switching element circuit for selecting each channel (which, being an example employing a thyristor, will be described later). Numeral 15 shows an electronically-operated tuner with a varactor diode.

Figure 3:
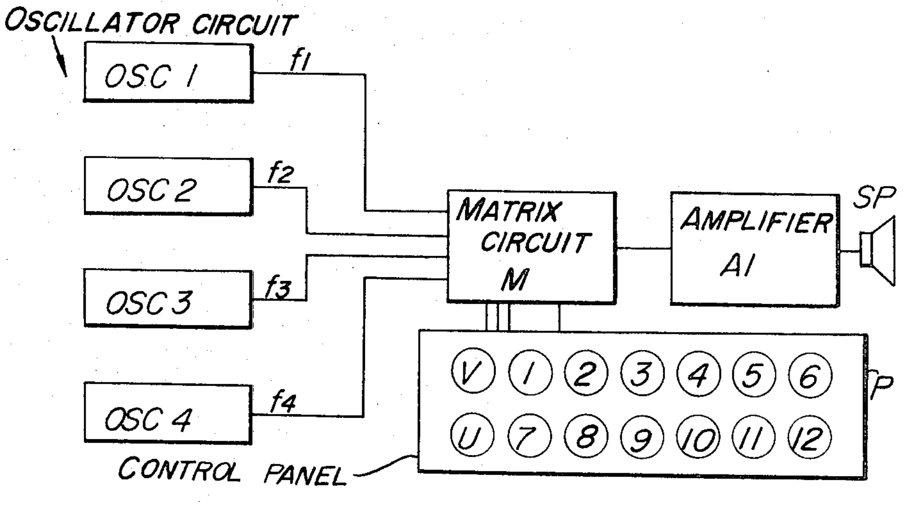
FIG. 3 shows a block diagram of an oscillation source.

An actual construction and operation of the above-described embodiment will be now explained in detail. First, an actual construction of the signal oscillation source 10 is illustrated in FIG. 3. Symbols OSC1, OSC2, OSC3 and OSC4 show oscillator circuits which are kept oscillating at the slightly different frequencies of $f_1, f_2, f_3$ and $f_4$ respectively. Symbol M shows a matrix circuit for combining the signals of the frequencies $f_1$, $f_2, f_3$ and $f_4$ into a signal to be applied to the receiver circuit 11. Symbol P shows a control panel provided with operating buttons designated by Ⓥ, ①, ②, etc. for selecting a desired channel. Symbol A1 shows an amplifier and symbol SP a speaker.

In switching between different channels, the depressing of a button on the control panel P causes a signal corresponding to the depressed button to be applied to the matrix circuit M. Since the outputs of the oscillator circuits OSC1 to OSC4 are kept applied to the matrix circuit M, the depressing of an operating button provides a predetermined combination of the oscillator output signals corresponding to that button. By depressing the button      for example, a combined signal of the frequencies $f_1$ and $f_3$ is obtained as an output of the matrix circuit M. This output is amplified by the amplifier A1 and radiated into the atmosphere as an ultrasonic wave through the speaker SP.

The provision of the four oscillator circuits as shown in FIG. 3 makes possible 16 (24) combinations of signals. (15 combinations, actually, since a combination of the frequencies $f_1, f_2, f_3$ and $f_4$ which are all OFF is eliminated.) In this case, some of the channels consists of a single frequency, say, $f_1$ among the ultrasonic signals radiated from the signal oscillation source 10. This may cause an erroneous operation due to external noise, which can be prevented by providing more oscillator circuits so that a remote control signal for any channel selection consists of a combination of a plurality of frequencies.

Detailed construction of the receiver circuit 11 is shown in FIG. 4, in which symbol MIC shows a microphone for detecting an ultrasonic wave, symbol A2 an amplifier, symbols F1 and F4 filters for picking up the frequencies $f_1$ to $f_4$ respectively, and symbols FF1 to FF4 flip-flops which are energized by the outputs from the filter F1 to F4 respectively. The receiver circuit 11 produces outputs $Q_A$, $\overline{Q}_A$; $Q_B$, $\overline{Q}_B$; $Q_C$, $\overline{Q}_C$; and $Q_D$, $\overline{Q}_D$ from the flip-flops FF1 to FF4 respectively corresponding to a signal contained in the ultrasonic wave received by the microphone MIC.

The outputs $Q_A$, $\overline{Q}_A$; $Q_B$, $\overline{Q}_B$; $Q_C$, $\overline{Q}_C$; and $Q_D$, $\overline{Q}_D$ of the flip-flops FF1 to FF4 are applied to the diode matrix circuit 12, the inputs and outputs of which have the relations as shown in FIG. 5, where the 4-digit figures on the output side indicate various combinations of 1 to 0 showing the presence and absence of signals $f_1$, $f_2$, $f_3$ and $f_4$ respectively. It is well known that application of the outputs of the flip-flops of FIG. 4 to the diode matrix circuit results in the outputs as shown in FIG. 5. The outputs from the diode matrix circuit 12 are applied to the signal decomposition circuit 13.

Figure 6:
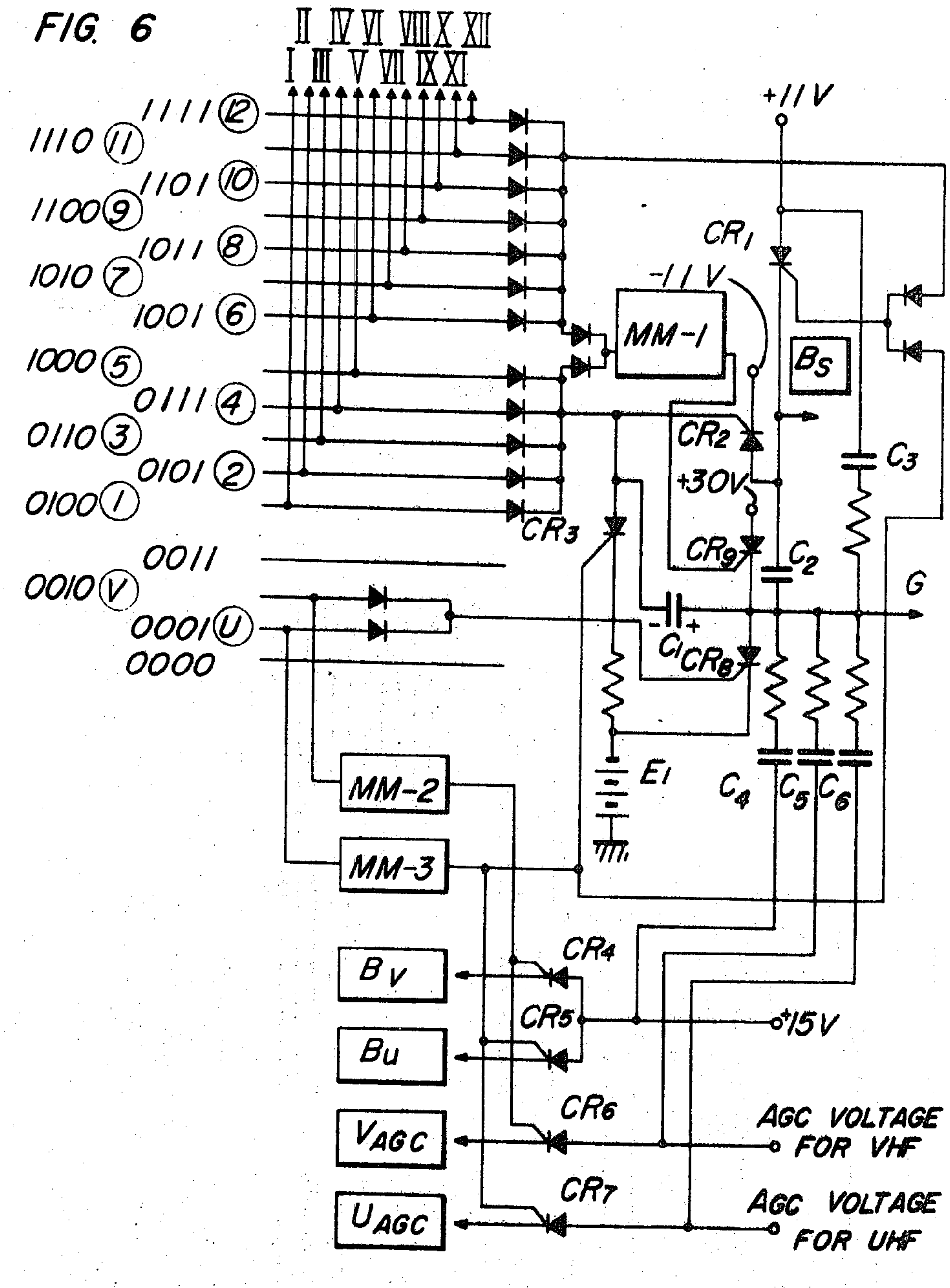
FIG. 6 is a circuit diagram showing the signal decomposition circuit.

The signal decomposition circuit 13 is as shown in FIG. 6, wherein depressing the buttons Ⓤ, Ⓥ, ①, ②, . . . . . . ⑫ of the signal oscillation source 10 of FIG. 3 produces corresponding binary code signals indicated beside them respectively. Symbols $B_S$, $B_U$, $B_V$, $V_{AGC}$ and $U_{AGC}$ show outputs directly applied to the electronically — operated tuner 15, while outputs, I, II, . . . . XII are applied to the switching element circuit 14.

Explanation will be made now of the operation of the circuit of FIG. 6. In the channel-selecting process of the electronically-operated tuner, ON and OFF operations of various source voltages are required beside changing the voltage applied to the variable capacitor elements. The table below shows the requirements of the electronically-operated tuner currently in use for general television receivers.

| | $B_V$ | $B_U$ | $B_S$ | $V_{AGC}$ | $U_{AGC}$ |
|---|---|---|---|---|---|
| Low Channel of VHF | +15V | | −11V | ON | OFF |
| High Channel of VHF | +15V | | +11V | ON | OFF |
| All UHF Channels | | +15V | +11V | OFF | ON |

In this table, symbol $B_V$ shows a B-power source voltage for VHF, symbol $B_U$ a B-power source voltage for UHF, symbol $B_S$ a voltage for switching between high and low-frequency channels, symbol $V_{AGC}$ an AGC terminal voltage for VHF and symbol $U_{AGC}$ and AGC terminal voltage for UHF. The circuit of FIG. 6 has been arranged to meet the requirements shown in the above table.

Figure 7:
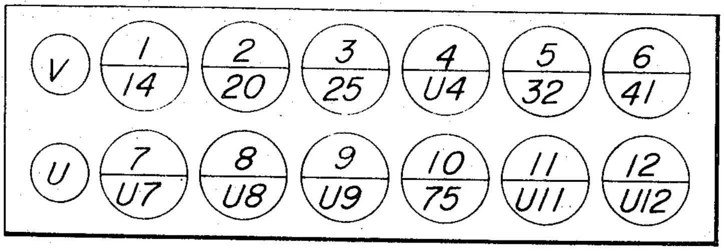
FIGS. 7 and 8 are outside views of oscillation source control panels according to other embodiments different from each other.
Figure 8:
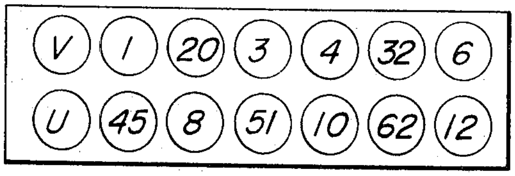

Prior to explaining the operation of this circuit in detail, the operation of channel selection will be described. When desiring to select, say, channel 8, the button Ⓥ is depressed first and then the button ⑧. Also, when it is desired to switch from channel 8 to channel 10, the button ⑩ is depressed after depressing the button Ⓥ. Further, when it is desired to tune the circuit to channel 32 of UHF, the button ⑤ is depressed after depressing the button Ⓤ. In the last-mentioned case, the circuit is so preset that channel 32 is selected by depressing the button ⑤. If it is difficult to remember that the button ⑤ indicates channel 32, for example, only the UHF buttons on the control panel of FIG. 3 may be pasted with a mark indicating a preset channel number as shown in FIG. 7, or the UHF channel numbers may replace the unused VHF channel numbers as shown in FIG. 8. It has already been explained that channel 8 is selected by depressing first the button Ⓥ and then the button ⑧. In this case, in order to prevent any change when the button ⑩ is depressed subsequently, an arrangement may be conveniently made in which the depressing of the button Ⓥ or Ⓤ constitutes a prerequisite for a successful depressing of any digit button.

Returning to the operation of the circuit shown in FIG. 6, the depressing of the button Ⓥ produces the signal "0010" and a single signal is applied to the Ⓥ 09 terminal. This signal is applied to the gate of the silicon-controlled rectifier $CR_8$ to turn it on. Since the potential at the junction point between the silicon-controlled rectifiers $CR_8$ and $CR_9$ is affected by the voltage −E, pulses are applied to all of the silicon-controlled rectifiers $CR_1$ to $CR_7$ through the capacitors $C_1$ to $C_6$ to turn off all of them.

A pulse delayed by $\Delta t$ is applied from the monostable multivibrator MM2 to the gates of the silicon-controlled rectifiers $CR_4$ and $CR_6$ to turn them on, thereby supplying $B_V$ and $V_{AGC}$ to the tuner 15 in the next stage. Depressing the button ⑧ causes the signal "1011" to be generated from the diode matrix 12, producing a pulse at the terminal ⑧ of FIG. 6. This pulse is applied not only to the output terminal VIII but to the gate of the silicon-controlled rectifier $CR_1$ to turn it on, thereby applying a voltage of 11V to the output terminal which generates the switching voltage $B_S$. This pulse is also passed through the monostable multivibrator MM1 and applied, a little later, to the gate of the silicon-controlled rectifier $CR_9$ to turn it on. The silicon-controlled rectifier $CR_9$ is connected to the other circuits through the capacitors $C_1$ to $C_6$ in FIG. 6; when this silicon-controlled rectifier $CR_9$ is turned on, the capacitors are charged by a power voltage of 30V supplied to the anode of the silicon-controlled rectifier $CR_9$. When capacitors $C_1$–$C_9$ have been charged, current does not flow through the silicon-controlled rectifier CRhd 9 and accordingly the silicon-controlled rectifier CRhd 9 is automatically turned off. The capacitor $C_1$ is charged in such a manner that its terminal connected to the side of the silicon-controlled rectifiers $CR_8$ and $CR_9$ become positive as shown in the drawing. Under this condition, when the silicon-controlled rectifier $CR_8$ is turned on, the positive side of the capacitor $C_1$ is reduced in potential to $-E_1$, with the result that the anodes of the silicon-controlled rectifiers $CR_1$ to $CR_7$ are reduced in potential by a maximum of $-(E_1 +$ 30), thereby making it possible to quickly turn off the silicon-controlled rectifiers $CR_1$ to $CR_7$. This meets the above-mentioned requirements for the high channel of VHF.

In order to perform a tuning operation for a UHF channel, the switching voltage $B_S$ of +11V is always required, which in turn results in the necessity for a circuit comprising the silicon-controlled rectifier $CR_3$. As in the case of VHF, a pulse generated by depressing the button Ⓤ and passed through the monostable multivibrator MM3 is applied to the silicon-controlled rectifiers $CR_5$ and $CR_7$ from which the voltage of +15V and $U_{AGC}$ are applied to the next stage.

For UHF, the pulse output of the monostable multivibrator gate of the is applied to the silicon-controlled rectifier $CR_3$ and then the silicon-controlled rectifier $CR_3$ turns on, rendering negative the gate of the silicon-controlled rectifier $CR_2$ connected to the silicon-controlled rectifier $CR_3$ by applying a negative voltage of $-E_1$, so that even if the buttons ①, ②, . . . . . ⑤

09 are depressed, the silicon-controlled rectifier CRz is not turned on. Thus, the voltage of −11V is prevented from being applied as a switching voltage $B_S$, while at the same time the silicon-controlled rectifier $CR_1$ is turned on thereby always applying the voltage of +11V to the switching voltage $B_S$. Even if any of the buttons ① to ⑫ are depressed, the silicon-controlled rectifier CR1 is kept on, and the switching voltage $B_S$ maintained at +11V since the gate of the silicon-controlled rectifier $CR_2$ is maintained negative. The other operations are the same as those for VHF.

Figure 9:
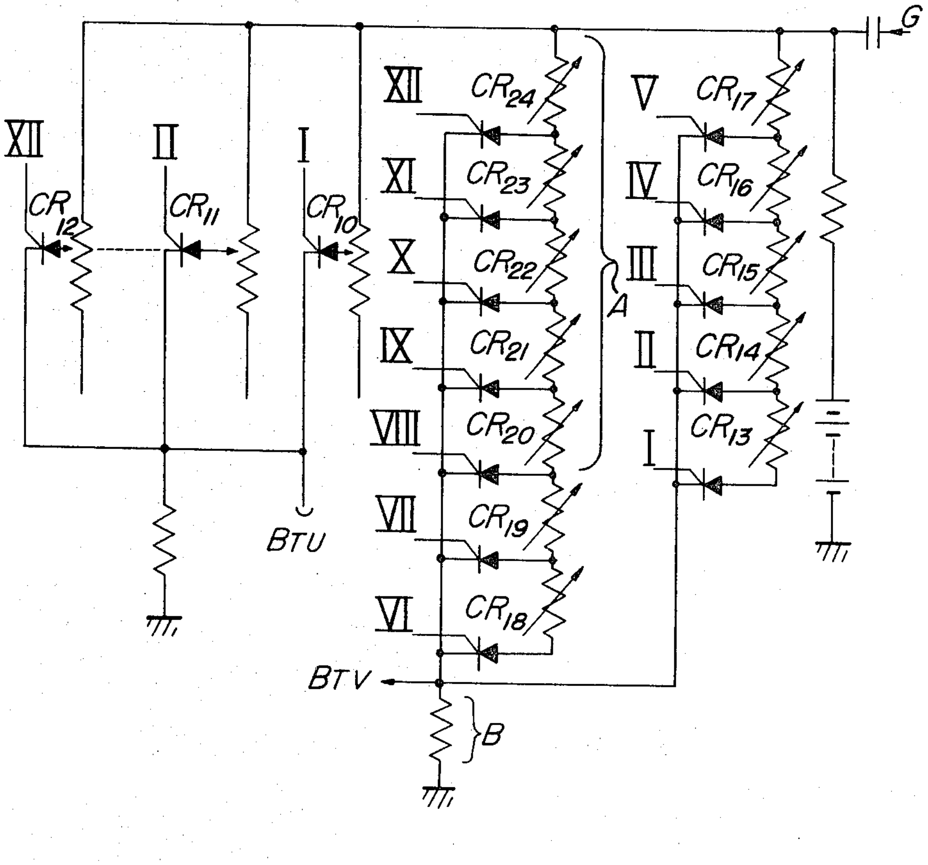
FIG. 9 is a circuit diagram showing a switching element circuit.

Explanation will be made of how the signal VIII for receiving the VHF channel 8 which is applied to the switching element circuit 14 functions as a tuning voltage. The detailed construction of the switching element circuit 14 is as shown in FIG. 9. Upon application of the pulse VIII the corresponding silicon-controlled rectifier element is turned on, whereby the divided voltage due to the resistors A and resistors B becomes a predetermined value of $B_{TV}$. A signal produced from the terminal G of FIG. 6 is applied to the terminal G of FIG. 9, thereby turning off all the silicon-controlled rectifiers shown in FIG. 9.

The operation is also the same for other VHF channels. In the case of UHF channels, a predetermined voltage $B_{TU}$ is applied as a tuning voltage similarly to the tuner 15.

Each of the circuits whose main component element include the silicon-controlled rectifiers $CR_{10}$ to $CR_{12}$ in FIG. 9 is provided for the purpose of generating the tuning voltage $B_{TU}$ for selecting a UHF channel, and it also includes a variable resistor connected in parallel with it for presetting the circuit in order to tune it to a desired channel out of a plurality of channels widely distributed in the UHF band. On the other hand, each of the circuits comprising mainly the silicon-controlled rectifiers $CR_{13}$ to $CR_{24}$ is for generating the tuning voltage $B_{TV}$ for selecting a desired VHF channel, and they provide a convenient device with simple construction in presetting it in such a manner as to receive all the channels in the VHF band in sequence.

What is claimed is:

1. A remote-control tuning system comprising a series-connected circuit consisting of a plurality of oscillators for generating signals of different frequencies; a first matrix circuit to which the outputs of said oscillators are applied and which combines said outputs according to a program preset by a means operated to selected a desired channel; and a speaker for converting the output of said first matrix circuit into an ultrasonic wave and radiating said ultrasonic wave into the atmosphere;

a microphone for receiving said ultrasonic wave and converting said ultrasonic wave to an electric signal; a converter in which said electric signal is decomposed into a plurality of signals of different frequencies by means of a plurality of filters covering different filter bands, said decomposed signals being converted into binary output voltages;

a second matrix circuit for receiving said binary output voltages and converting said voltages into a plurality of corresponding binary code signals at a plurality of output terminals;

a switching element circuit comprising a first plurality of variable series-connected resistors; a first fixed resistor; a first plurality of silicon-controlled rectifiers coupled between said first fixed resistor and corresponding junctions of said first plurality of series-connected variable resistors, application of a binary code signal from said second matrix circuit to a selected one of said first plurality of silicon-controlled rectifiers turning said selected rectifier on to couple a predetermined number of said variable resistors in series with said fixed resistor and a voltage source, the voltage across said first fixed resistor being coupled to a varactor diode in a VHF tuner section; a second plurality of variable resistors having a common terminal coupled to said voltage source; a second fixed resistor; a second plurality of silicon-controlled rectifiers coupled between said second fixed resistor and taps on corresponding ones of said second plurality of variable resistors, application of a binary code signal to one of said second plurality of silicon-controlled rectifiers coupling a predetermined one of said second plurality of variable resistors to said second fixed resistor and said voltage source, the voltage across said second fixed resistor being coupled to a varactor diode in a UHF tuner section; and means coupling binary code signals from predetermined output terminals of said second matrix circuit to the silicon-controlled rectifiers in said switching element circuit, said means switching said silicon-controlled rectifiers on or off in accordance with the signal at said predetermined output terminals.

2. A remote-control tuning system according to claim 1 which further comprises switching means for switching AGC signals applied to said VHF and UHF tuner sections by means of the output from said second matrix circuit.

3. A remote-control tuning system according to claim 1, further comprising a reset silicon-controlled rectifier inserted between a power supply and a line for applying a resetting signal through a capacitor to a third plurality of silicon-controlled rectifiers, and a monostable multivibrator which is set simultaneously with the application of a code signal from said second matrix circuit to said third plurality of silicon-controlled rectifiers, said reset silicon-controlled rectifier being caused to conduct by a delayed output of said multivibrator, said capacitor being maintained charged thereby to enable succeeding resetting operations.

4. A remote-control tuning system according to claim 1, further comprising a replaceable channel indicator provided in a means for selecting a combined signal generated by said oscillation source.

5. A remote-control tuning system according to claim 1, wherein said first matrix circuit is coupled to a plurality of oscillators in such a manner that an output signal produced by said transmitting means for selecting a channel always consists of at least two signals of different frequencies combined with each other.

* * * * *